(12) United States Patent
Lin et al.

(10) Patent No.: US 12,002,522 B2
(45) Date of Patent: Jun. 4, 2024

(54) MEMORY DEVICE AND OPERATION METHOD THEREOF

(71) Applicant: MACRONIX INTERNATIONAL CO., LTD., Hsinchu (TW)

(72) Inventors: Tao-Yuan Lin, Taipei (TW); I-Chen Yang, Miaoli County (TW); Yao-Wen Chang, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 182 days.

(21) Appl. No.: 17/743,493

(22) Filed: May 13, 2022

(65) Prior Publication Data

US 2023/0368849 A1    Nov. 16, 2023

(51) Int. Cl.
 *G11C 16/00*  (2006.01)
 *G11C 16/10*  (2006.01)
 *G11C 16/34*  (2006.01)

(52) U.S. Cl.
 CPC .......... *G11C 16/3427* (2013.01); *G11C 16/10* (2013.01)

(58) Field of Classification Search
 CPC ... G11C 16/342; G11C 16/10; G11C 11/5628; G11C 11/5642; G11C 16/08; G11C 16/0483; G11C 16/28
 See application file for complete search history.

(56) References Cited

U.S. PATENT DOCUMENTS

| | | | |
|---|---|---|---|
| 9,620,233 B1 | 4/2017 | Dong | |
| 2011/0305088 A1 | 12/2011 | Huang | |
| 2013/0322179 A1 | 12/2013 | Huang | |
| 2013/0329496 A1* | 12/2013 | Lee | G11C 16/16 365/185.11 |
| 2015/0162090 A1* | 6/2015 | Sakui | G11C 16/14 365/185.11 |
| 2015/0294724 A1* | 10/2015 | Nam | G11C 16/10 365/185.11 |
| 2020/0411105 A1 | 12/2020 | Lee | |
| 2021/0272637 A1 | 9/2021 | Chen | |

OTHER PUBLICATIONS

Xia, et al.: "Analysis and Optimization of Temporary Read Errors in 3D NAND Flash Memories"; IEEE Electron Device Letters, vol. 42, No. 6, Jun. 2021; pp. 820-823.

* cited by examiner

*Primary Examiner* — Uyen Smet
(74) *Attorney, Agent, or Firm* — McClure, Qualey & Rodack, LLP

(57) ABSTRACT

A memory device and an operation method thereof are provided. The operation method includes: in a programming operation, programming a plurality of threshold voltages of a plurality of switches on a plurality of string select lines and a plurality of ground select lines as a first reference threshold voltage, and programming a plurality of threshold voltages of a plurality of dummy memory cells on a plurality of dummy word lines as being gradually increased along a first direction or a second direction, and the threshold voltages of the dummy memory cells being higher than the first reference threshold voltage; wherein the first direction being from the string select lines to a plurality of word lines and the second direction being from the ground select lines to the word lines.

10 Claims, 8 Drawing Sheets

MEMORY DEVICE AND OPERATION METHOD THEREOF

TECHNICAL FIELD

The disclosure relates in general to a memory device and an operation method thereof.

BACKGROUND

In memory devices, after a long idle period, the read operation (also referred as a first read) on the memory device will have high read current, low threshold voltage and temporal read errors. However, temporal read error usually will not occur at the next read (also referred as a second read) because the idle time between two consecutive read operations is usually not too long.

FIG. 1A shows read waveforms at the first read and the second read. The idle time between the first read (100 μs) and the second read (100 μs) is usually 10 μs. As shown in FIG. 1A, the read voltage Vread and the threshold voltage Vt are both 1.5V, the drain voltage Vd is 0.6V and the pass voltage Vpass is 8V.

FIG. 1B shows the read current (ID) and the read time at the first read and the second read. As shown in FIG. 1B, the read current at the first read is higher than the read current at the second read. The timing T1 refers to the sensing timing. At the sensing timing T1, the read current is sensed to correspond to the threshold voltage of the memory cell for determining the threshold voltage of the memory cell. As for the first read, a lower threshold voltage is corresponded and thus the temporal read errors are occurred. At the second read, a normal threshold voltage is corresponded and thus the temporal read errors are not easily occurred.

FIG. 1C and FIG. 1D show the second read current and the read time under different idle periods, wherein the horizontal axis in FIG. 1C refers to the second read time and the horizontal axis in FIG. 1D refers to the idle time. As shown in FIG. 1C and FIG. 1D, when the idle period is longer (for example 1s), the read current at second read is high and thus the temporal read errors are easily occurred. When the idle period is shorter (for example 10 μs), the read current at second read is low and thus the temporal read errors are not easily occurred.

Thus, how to prevent the temporal read errors in the memory device is one of major efforts.

SUMMARY

According to one embodiment, provided is an operation method for a memory device. The memory device includes a plurality of ground select lines, a plurality of string select lines, a plurality of word lines, a plurality of dummy word lines, a first part of the dummy word lines adjacent the string select lines and a second part of the dummy word lines adjacent the ground select lines, the word lines being between the first part of the dummy word lines and the second part of the dummy word lines. The operation method includes: in a programming operation, programming a plurality of threshold voltages of a plurality of switches on the string select lines and the ground select lines as a first reference threshold voltage, and programming a plurality of threshold voltages of a plurality of dummy memory cells on the dummy word lines as being gradually increased along a first direction or a second direction, and the threshold voltages of the dummy memory cells being higher than the first reference threshold voltage; wherein the first direction being from the string select lines to the word lines and the second direction being from the ground select lines to the word lines.

According to another embodiment, provided is a memory device including: a plurality of bit lines; a plurality of ground select lines, a plurality of first switches being on intersection of the bit lines and the ground select lines; a plurality of string select lines, a plurality of second switches being on intersection of the bit lines and the string select lines; a plurality of word lines, a plurality of memory cells being on intersection of the bit lines and the word lines; and a plurality of dummy word lines, a plurality of dummy memory cells being on intersection of the bit lines and the dummy word lines; wherein a first part of the dummy word lines are adjacent the string select lines; a second part of the dummy word lines are adjacent the ground select lines; the word lines are between the first part of the dummy word lines and the second part of the dummy word lines; a plurality of threshold voltages of a plurality of switches on the string select lines and the ground select lines are programmed to have a first reference threshold voltage, and a plurality of threshold voltages of the dummy memory cells on the dummy word lines are programmed to be gradually increased along a first direction or a second direction, and the threshold voltages of the dummy memory cells are higher than the first reference threshold voltage; wherein the first direction being from the string select lines to the word lines and the second direction being from the ground select lines to the word lines.

Figure 1A:
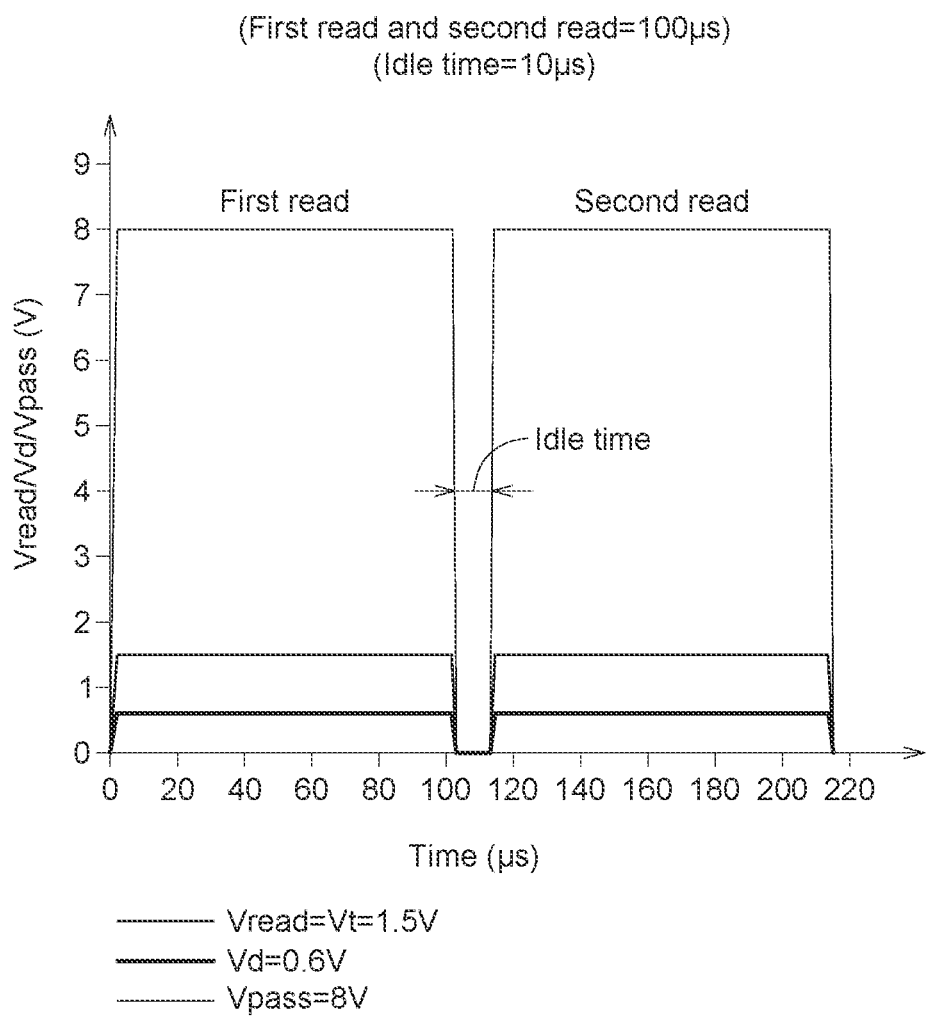
FIG. 1A shows read waveforms at the first read and the second read.
Figure 1B:
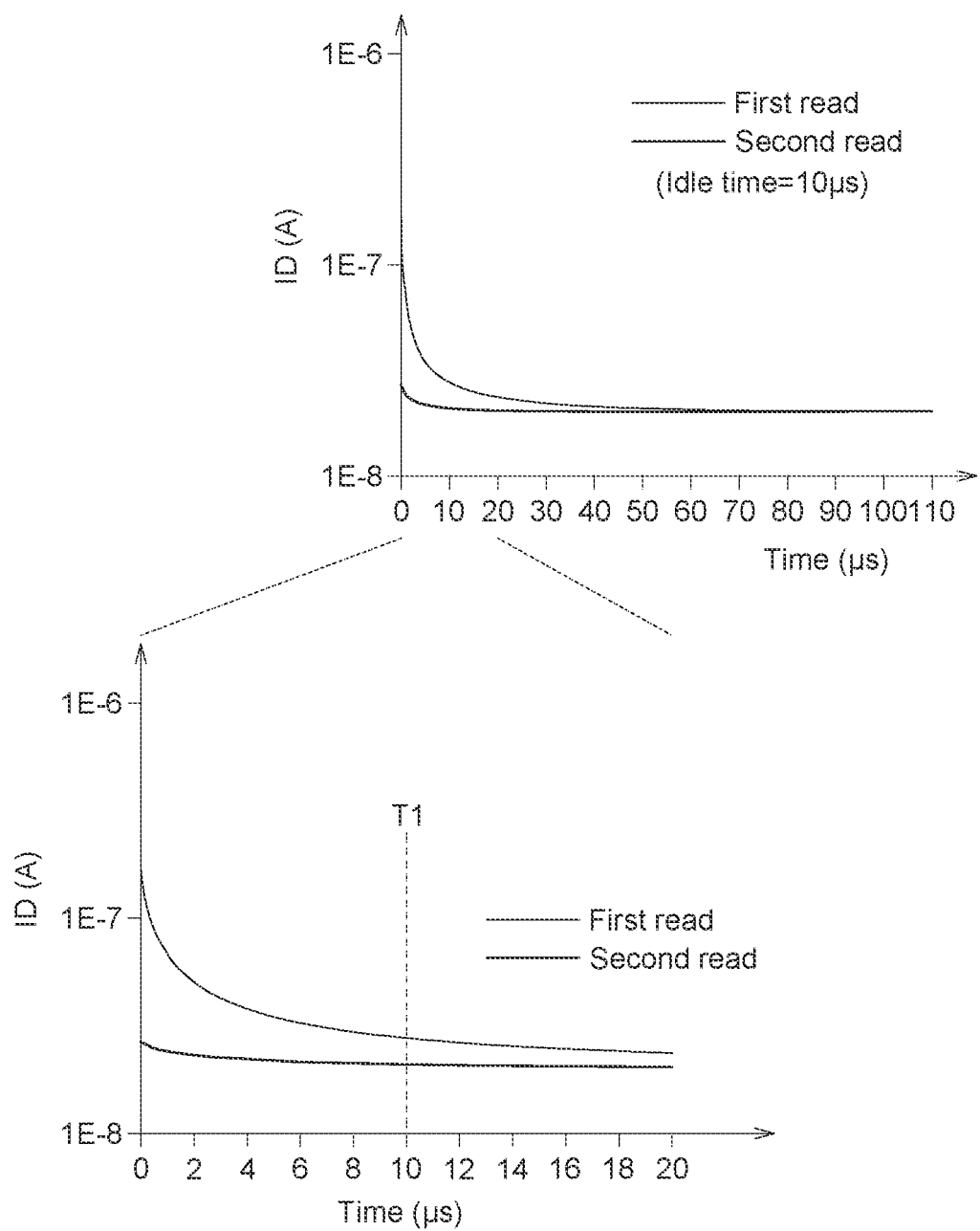
FIG. 1B shows read current (ID) and read time at the first read and the second read.
Figure 1C:
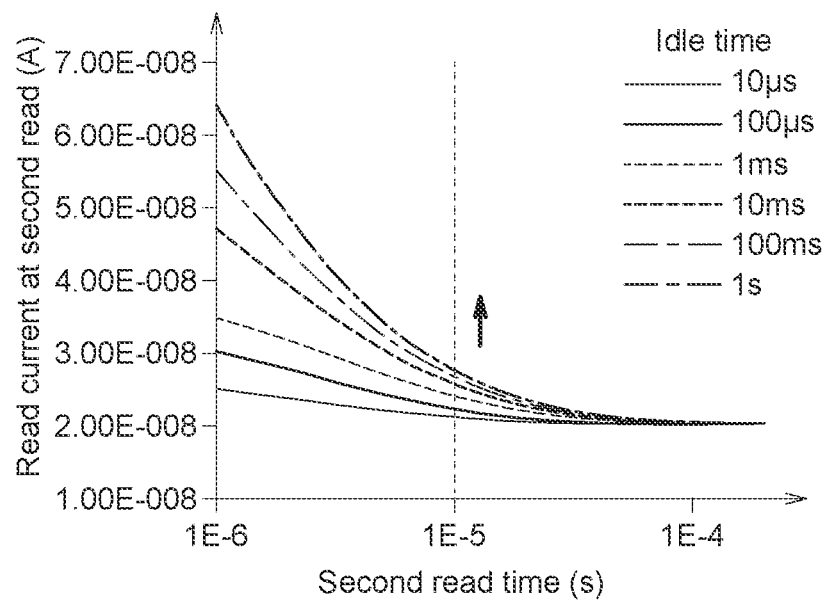
FIG. 1C and FIG. 1D show the second read current and the read time under different idle periods.
Figure 1D:
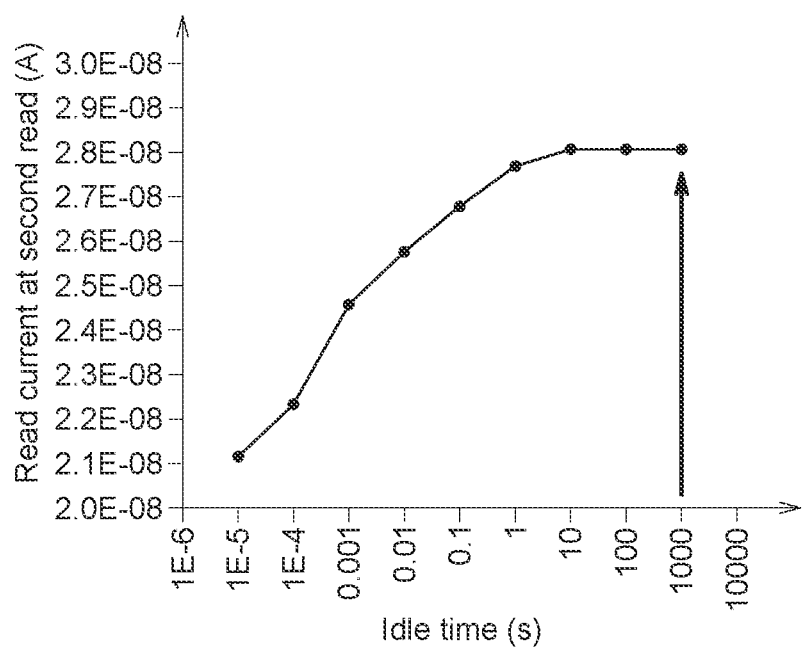

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 2:
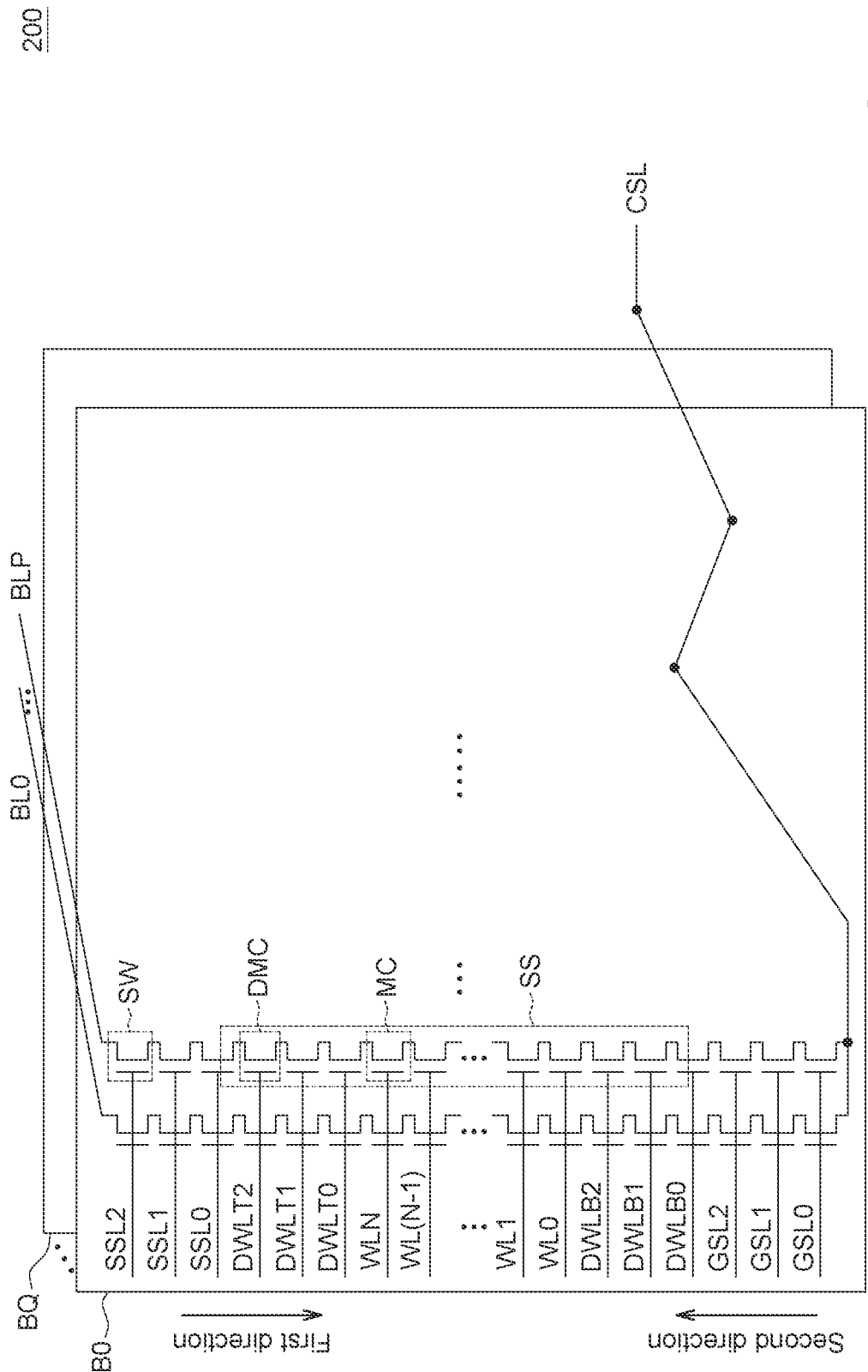
FIG. 2 shows an equivalent circuit diagram of a memory device according to one embodiment of the application.

FIG. 2 shows an equivalent circuit diagram of a memory device 200 according to one embodiment of the application. The memory device 200 is for example but not limited by, three dimension (3D) memory device. As shown in FIG. 2, the memory device 200 includes a plurality of memory blocks B0-BQ (Q being a positive integer), a common source line CSL, a plurality of word lines WL0-WLN (N being a positive integer), a plurality of dummy word lines, a plurality of bit lines BL0-BLP (P being a positive integer), a plurality of string select lines and a plurality of ground select lines (GSL). FIG. 2 shows three string select lines SSL0-SSL2, three ground select lines GSL0-GSL2 and six dummy word lines DWLT0-DWLT2 and DWLB0-DWLB2, but the application is not limited by this. Respective number of the string select lines, the ground select lines and the dummy word lines may be different from FIG. 2, which is still within the scope and the spirit of the application. Still further, the dummy word lines DWLT0-DWLT2 adjacent to the string select lines SSL0-SSL2 may be referred as a first part of the dummy word lines; and the dummy word lines WLB0-DWLB2 adjacent to the ground select lines GSL0-GSL2 may be referred as a second part of the dummy word lines. The word lines WL0-WLN are between the first part of the dummy word lines and the second part of the dummy word lines.

As shown in FIG. 2, in the memory device 200, the signal lines are positioned in sequence, from bottom to top: the ground select lines GSL0-GSL2, the dummy word lines DWLB0-DWLB2, the word lines WL0-WLN, the dummy word lines DWLT0-DWLT2 and the string select lines SSL0-SSL2. That is, the ground select line GSL0 is at bottom while the string select line SSL2 is at top.

Each of the memory blocks B0-BQ includes a plurality of switches SW and a plurality of memory strings SS. Each of the memory strings SS includes a plurality of memory cells MC. The memory cells MC are at intersections of the word lines WL0-WLN and the bit lines BL0-BLP. Each of the memory strings SS further includes a plurality of dummy memory cells DMC. The dummy memory cells DMC are at intersections of the dummy word lines DWLB0-DWLB2 and the bit lines BL0-BLP, or the dummy memory cells DMC are at intersections of the dummy word lines DWLT0-DWLT2 and the bit lines BL0-BLP. In the same memory block, the memory cells MC coupled to the same bit line form a memory string SS. The memory cells MC and the dummy memory cells DMC are for example but not limited by, implemented by MOSFET transistors. The application is not limited by this. The memory cells MC and the dummy memory cells DMC are implemented by similar elements, which are still within the spirit and the scope of the application.

The switches SW are at intersections of the string select lines SSL0-SSL2 and the bit lines BL0-BLP, or at intersections of the ground select lines GSL0-GSL2 and the bit lines BL0-BLP, respectively. When a corresponding memory string SS is selected, a corresponding switch SW is turned on. The switches SW are for example but not limited by, implemented by MOSFET transistors. The application is not limited by this. The switches SW are implemented by similar elements, which are still within the spirit and the scope of the application.

A plurality of cell currents flowing through the memory strings SS are input into a backend corresponding circuit via the common source line CSL, to perform corresponding operations.

In one embodiment of the application, in programming operations, the dummy memory cells DMC and/or the switches SW on the string select lines SSL0-SSL2, the ground select lines GSL0-GSL2, the dummy word lines DWLB0-DWLB2, the dummy word lines DWLT0-DWLT2 are programmed to have the following threshold voltage programming conditions as below. The application is not limited by this.

The switches SW of the string select lines SSL0-SSL2 and the ground select lines GSL0-GSL2 are programmed to have a first reference threshold voltage. In one embodiment of the application, the first reference threshold voltage is for example but not limited by, 2V.

The dummy memory cells DMC of the dummy word lines DWLB0 and DWLT2 are programmed to have a second reference threshold voltage higher than the first reference threshold voltage. In one embodiment of the application, the second reference threshold voltage is for example but not limited by, 3V.

The dummy memory cells DMC of the dummy word lines DWLB1 and DWLT1 are programmed to have a third reference threshold voltage higher than the second reference threshold voltage. In one embodiment of the application, the third reference threshold voltage is for example but not limited by, 4V.

The dummy memory cells DMC of the dummy word lines DWLB2 and DWLT0 are programmed to have a fourth reference threshold voltage higher than the third reference threshold voltage. In one embodiment of the application, the fourth reference threshold voltage is for example but not limited by, 5V.

That is, in one embodiment of the application, after programming, the respective threshold voltages of the dummy memory cells DMC on the dummy word lines DWLB0-DWLB2 and DWLT0-DWLT2 are programmed to be increased along a first direction or a second direction. The first direction is from the string select lines SSL0-SSL2 to the word lines WL0-WLN; and the second direction is from the ground select lines GSL0-GSL2 to the word lines WL0-WLN.

In one embodiment of the application, after end of the first read, the pass voltage applied to the unselected word lines is lowered to logic low level, and the region (that is, the memory cells MC on the word lines WL0-WLN) between the high threshold voltage dummy memory cells DMC on the dummy word lines DWLT0 and DWLB2 creates down coupling environment during the idle time between the first read and the second read.

For simplicity, N=47 is taken as an example but the application is not limited by this. For the above example, the word lines (for example but not limited by WL10 and WL30) on some predetermined locations have high threshold voltage memory cells MC while other word lines (for example but not limited by WL20 and WL30) on some predetermined locations have low threshold voltage memory cells MC.

In the prior art, after the end of the first read, the pass voltage for the unselected word lines is lowered to logic low level (for example GND), and thus, the memory cells on the word line WL20 are at the down coupling region formed by the word lines WL10 and WL30. That is because the memory cells (having low threshold voltage Vt) on the word line WL20 are between the high threshold voltage memory cells on the word lines WL10 and WL30. However, the memory cells (having low threshold voltage Vt) on the word line WL40 are not at the down coupling region formed by the word lines WL10 and WL30. That is because in the prior art, the switches on the SSL side and on the GSL side usually have low threshold voltage Vt (for example 2V). Therefore, in the prior art, the memory cells (having low threshold voltage Vt) on the word line WL40 are not at the down coupling region and it is not easy to keep the memory string at the strong inversion state. Thus the temporal read errors are serious in the prior art.

On the contrary, in one embodiment of the application, after the end of the first read, the pass voltage for the unselected word lines is lowered to logic low level (for example GND), and thus, the memory cells on the word line WL20 are at the down coupling region formed by the word lines WL10 and WL30. Also, the memory cells (having low threshold voltage Vt) on the word line WL40 are at the down coupling region formed by the word line WL30 and the dummy word lines DWLT0-DWLT2. Therefore, in one embodiment of the application, it is easy to keep the memory string at the strong inversion state and thus the temporal read errors are effectively suppressed.

In one embodiment of the application, during the idle period between the first read and the second read, high threshold voltage dummy memory cells are used to create down coupling conditions and environments.

In one embodiment of the application, down coupling refers to that, after the end of the read operations, if the memory cells are surrounded by high threshold voltage memory cells (or dummy memory cells), then when the pass voltage Vpass is down to 0V, the memory cells which are between the high threshold voltage memory cells (or dummy memory cells) enter into the down coupling. When there is down coupling, the electrons in the memory string channels are temporarily trapped and the memory cells are kept at the strong inversion state for a longer time period. Therefore, the advantages rely on that, the de-trapping behavior of the memory cells in the grain boundary trap of the poly channel is reduced and thus the trapping status of the memory cells in the grain boundary trap is kept as much as possible. Reducing the trapping de-trapping behavior also reduces the threshold voltage (Vt) variation in the next read. By so, in the next read operation, it is likely to sense the correct read current and there are fewer problems in determining the threshold voltage. Thus the temporal read errors are prevented.

In one embodiment of the application, during the idle period between the first read and the second read, respective dummy memory cells (having high threshold voltage) on the GSL side and the SSL side are in the down coupling to keep the memory string at the strong inversion state for delaying the de-trapping behavior of the memory cells in the grain boundary trap of the poly channel.

In one embodiment of the application, the dummy memory cells on the GSL side and the SSL side create gradually-increased dummy memory cell threshold voltage distribution. By so, the band-to-band leakage current near the high threshold voltage (Vt=5V) dummy memory cells is reduced, the memory strings are kept at the strong inversion state for a longer time period, and the de-trapping behavior of the memory cells in the grain boundary trap of the poly channel is further delayed.

In one embodiment of the application, the temporal read errors are effectively suppressed without additional circuit area cost.

Figure 3:
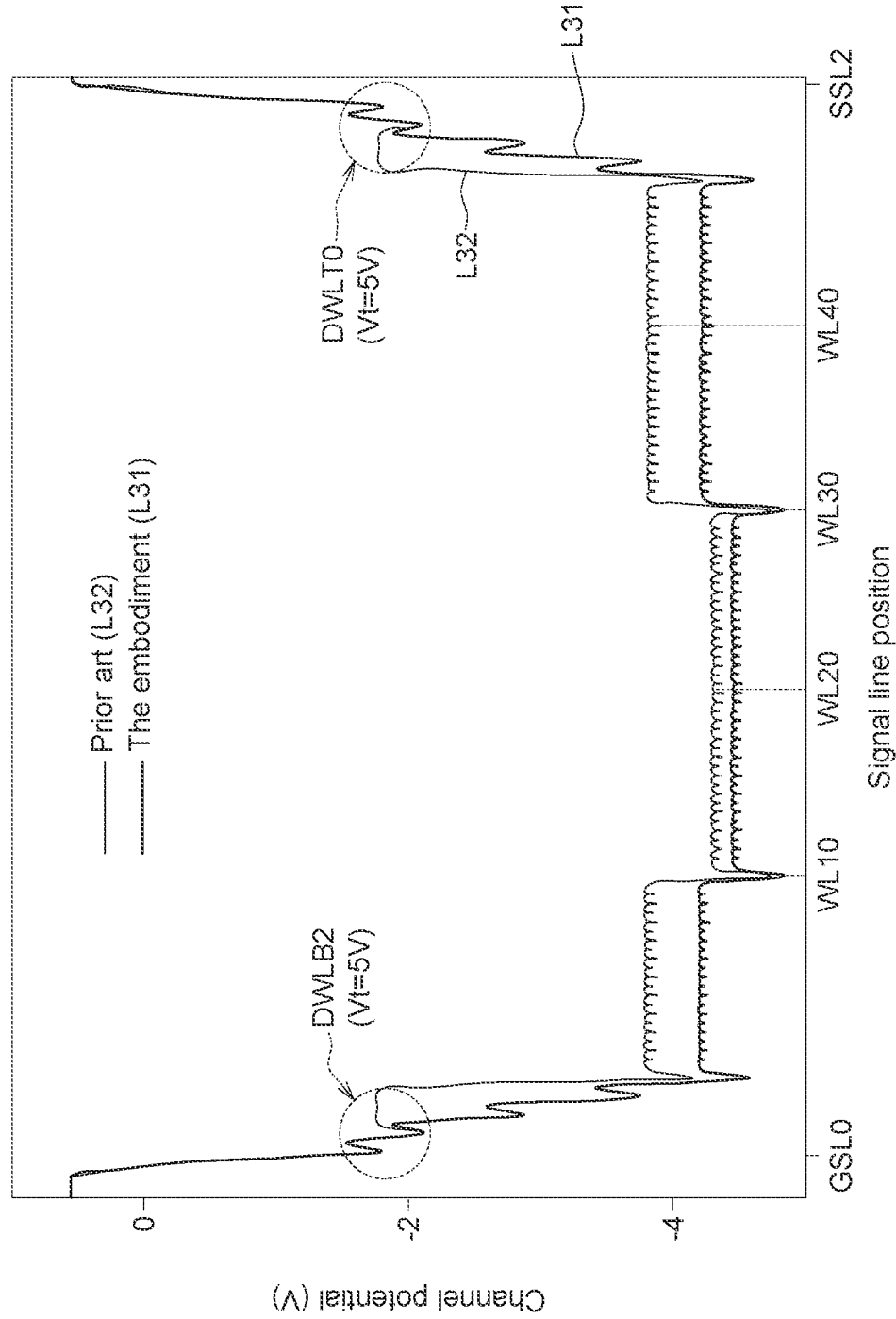
FIG. 3 shows channel potential and signal line positions according to the prior art and one embodiment of the application.

FIG. 3 shows the channel potential according to the prior art and one embodiment of the application. In FIG. 3, the horizontal axis refers to a signal line position, the leftmost position refers to the ground select line GSL0 at the bottom while the rightmost position refers to the string select line SSL2 at the top. In FIG. 3, the vertical axis refers to the channel potential. The curve L31 indicates the channel potentials at the signal positions measured at the end of the first read operation in one embodiment of the application; and the curve L32 indicates the channel potentials at the signal positions measured at the end of the first read operation in the prior art. In FIG. 3, the memory cells MC and/or the dummy memory cells DMC on the ground select lines GSL0-GSL2, the dummy word lines DWLB0-DWLB2, the word lines WL0-WLN, the dummy word lines DWLT0-DWLT2 and/or the string select lines SSL0-SSL21 have threshold voltages setting as described above.

By comparing the curves L31 and L32, in one embodiment of the application, the dummy memory cells on the GSL side and the SSL side create gradually-increased dummy memory cell threshold voltage distribution to reduce the channel potential difference near the high threshold voltage dummy memory cells, to reduce band-to-band leakage current. Further, the memory strings are kept at the strong inversion state for a longer time period, and the de-trapping behavior of the memory cells in the grain boundary trap of the poly channel is further delayed for reducing Vt variation of the memory cells and for reducing temporal read errors.

Figure 4A:
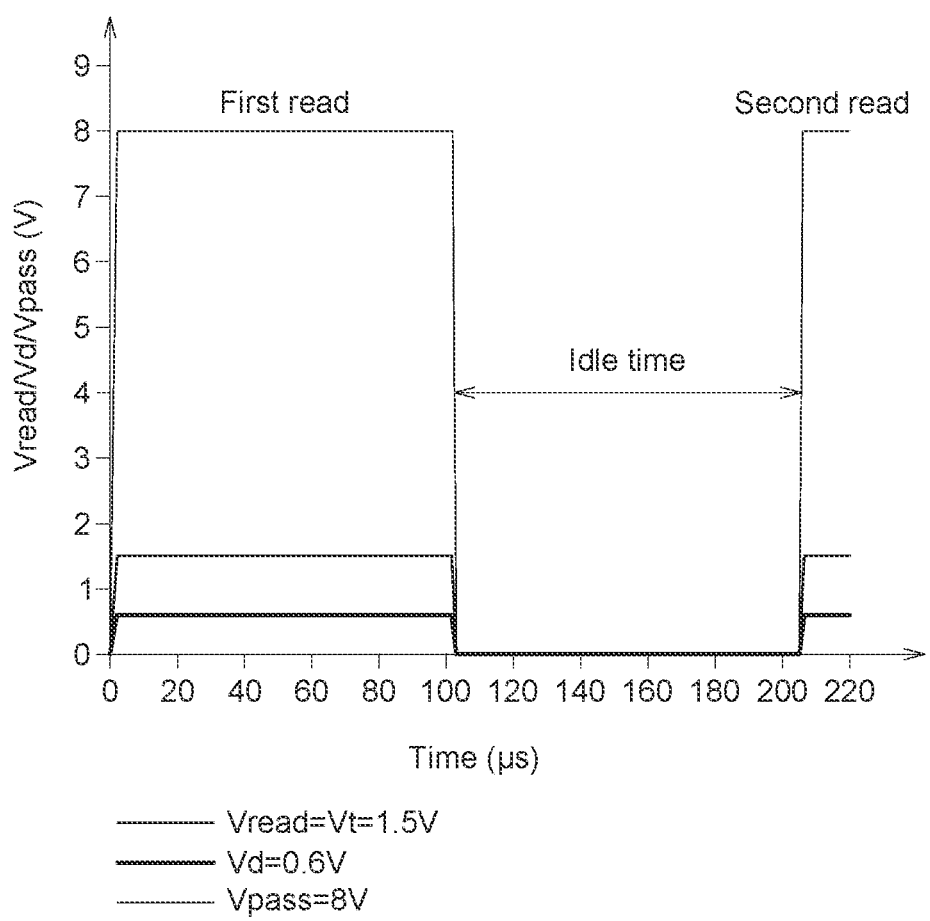
FIG. 4A shows the read waveforms at the first read and the second read in one embodiment of the application.

FIG. 4A shows the read waveforms at the first read and the second read in one embodiment of the application. The idle time between the first read and the second read may be 10 μs, 100 μs, 1 ms, 10 ms, 100 ms, 1 s, 10 s, 100 s or 1000 s. As shown in FIG. 4A, the read voltage Vread and the threshold voltage Vt are both 1.5V, the drain voltage Vd is 0.6V and the pass voltage Vpass is 8V, which is not to limit the application.

Figure 4B:
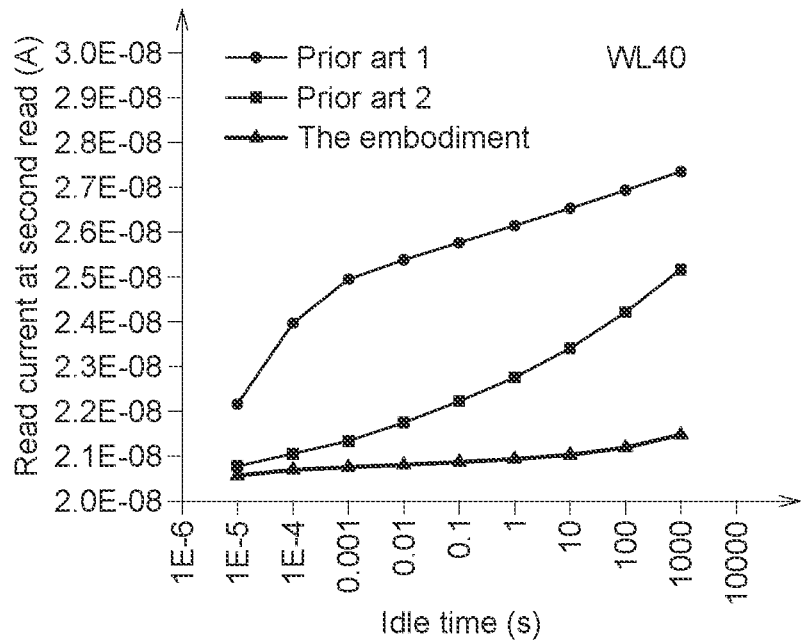
FIG. 4B shows the idle time (between the first read and the second read) and the read current at the second read on a first word line in the prior art and in one embodiment of the application.
Figure 4C:
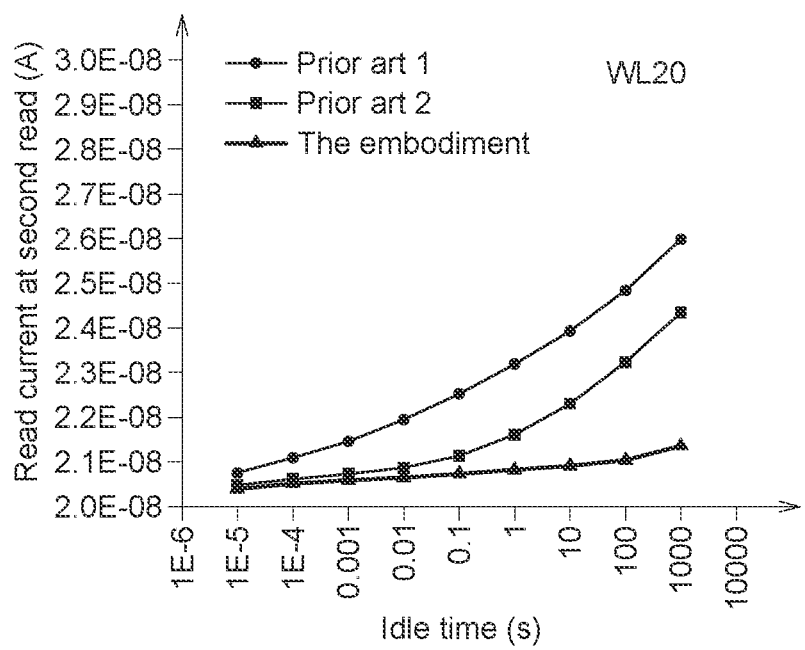
FIG. 4C shows the idle time (between the first read and the second read) and the read current at the second read on a second word line in the prior art and in one embodiment of the application.

FIG. 4B shows the idle time (between the first read and the second read) and the read current at the second read on the word line WL40 in the prior art and in one embodiment of the application; and FIG. 4C shows the idle time (between the first read and the second read) and the read current at the second read on the word line WL20 in the prior art and in one embodiment of the application.

As shown in FIG. 4B and FIG. 4C, no matter what value the idle time is, the read current at the second read in one embodiment of the application is much lower than the read current at the second read in the prior art 1 and the prior art 2. In the prior art 1 and the prior art 2, a higher second read current is corresponded to a lower threshold voltage and thus the temporal read errors are likely to occur. On the contrary, the temporal read errors are effectively suppressed in one embodiment of the application.

Figure 5:
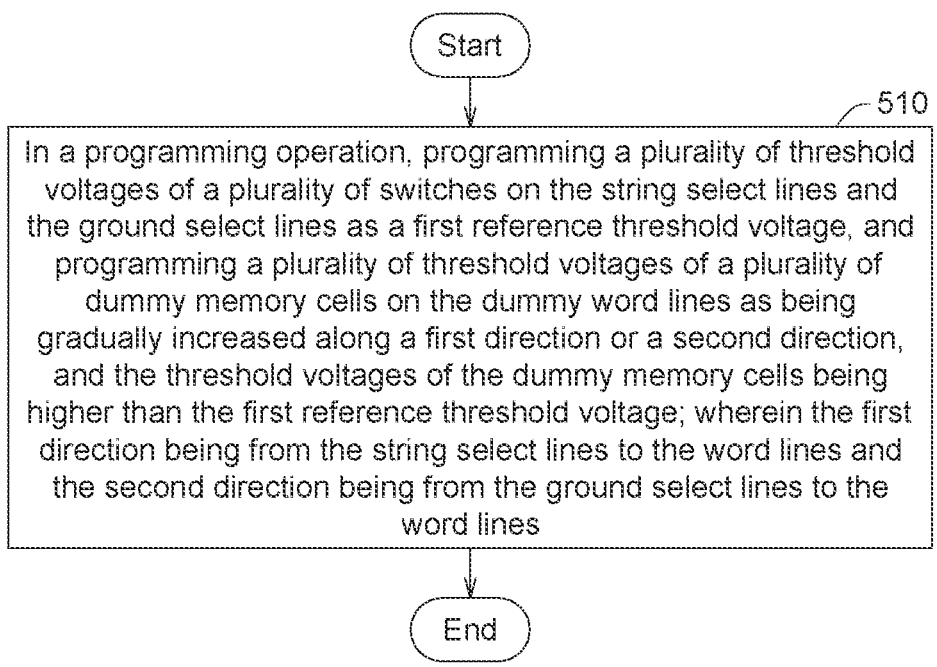
FIG. 5 shows an operation method for a memory device according to one embodiment of the application.

FIG. 5 shows an operation method for a memory device according to one embodiment of the application. As shown in FIG. 5, the operation method for the memory device includes: in a programming operation, programming a plurality of threshold voltages of a plurality of switches on the string select lines and the ground select lines as a first reference threshold voltage, and programming a plurality of threshold voltages of a plurality of dummy memory cells on the dummy word lines as being gradually increased along a first direction or a second direction, and the threshold voltages of the dummy memory cells being higher than the first reference threshold voltage; wherein the first direction being from the string select lines to the word lines and the second direction being from the ground select lines to the word lines (510).

One embodiment of the application is applied to poly-Silicon (poly-Si) channel 3D memory device, for example but not limited by, 3D NAND memory device, 3D NOR memory device and so on.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a memory device including a plurality of ground select lines, a plurality of string select lines, a plurality of word lines, a plurality of dummy word lines, a first part of the dummy word lines adjacent the string select lines and a second part of the dummy word lines adjacent the ground select lines, the word lines being between the first part of the dummy word lines and the second part of the dummy word lines, the operation method including:

in a programming operation, programming a plurality of threshold voltages of a plurality of switches on the string select lines and the ground select lines as a first reference threshold voltage, and programming a plurality of threshold voltages of a plurality of dummy memory cells on the dummy word lines, each of the plurality of threshold voltages being gradually increased along a first direction or a second direction, and the threshold voltages of the dummy memory cells being higher than the first reference threshold voltage;

wherein the first direction being from the string select lines to the word lines and the second direction being from the ground select lines to the word lines.

2. The operation method for the memory device according to claim 1, wherein on the first direction, the plurality of threshold voltages of the dummy memory cells on the first part of the dummy word lines are gradually increased and higher than the first reference threshold voltage.

3. The operation method for the memory device according to claim 2, wherein the first part of the dummy word lines at least includes a first dummy word line, a second dummy word line and a third dummy word line, the first dummy word line being adjacent to the string select lines;

the plurality of threshold voltages of the dummy memory cells on the first dummy word line are programmed to have a second reference threshold voltage higher than the first reference threshold voltage;

the plurality of threshold voltages of the dummy memory cells on the second dummy word line are programmed to have a third reference threshold voltage higher than the second reference threshold voltage; and the plurality of threshold voltages of the dummy memory cells on the third dummy word line are programmed to have a fourth reference threshold voltage higher than the third reference threshold voltage.

4. The operation method for the memory device according to claim 3, wherein on the second direction, the plurality of threshold voltages of the dummy memory cells on the second part of the dummy word lines are gradually increased and higher than the first reference threshold voltage.

5. The operation method for the memory device according to claim 4, wherein the second part of the dummy word lines at least includes a fourth dummy word line, a fifth dummy word line and a sixth dummy word line, the fourth dummy word line being adjacent to the ground select lines;

the plurality of threshold voltages of the dummy memory cells on the fourth dummy word line are programmed to have the second reference threshold voltage;

the plurality of threshold voltages of the dummy memory cells on the fifth dummy word line are programmed to have the third reference threshold voltage; and the plurality of threshold voltages of the dummy memory cells on the sixth dummy word line are programmed to have the fourth reference threshold voltage.

6. A memory device including:

a plurality of bit lines, a plurality of ground select lines, a plurality of first switches being on intersection of the bit lines and the ground select lines;

a plurality of string select lines, a plurality of second switches being on intersection of the bit lines and the string select lines;

a plurality of word lines, a plurality of memory cells being on intersection of the bit lines and the word lines; and a plurality of dummy word lines, a plurality of dummy memory cells being on intersection of the bit lines and the dummy word lines;

wherein a first part of the dummy word lines are adjacent the string select lines;

a second part of the dummy word lines are adjacent the ground select lines;

the word lines are between the first part of the dummy word lines and the second part of the dummy word lines;

a plurality of threshold voltages of a plurality of switches on the string select lines and the ground select lines are programmed to have a first reference threshold voltage, and a plurality of threshold voltages of the dummy memory cells on the dummy word lines are programmed, each of the plurality of threshold voltages of the dummy memory cells on the dummy word lines gradually increased along a first direction or a second direction, and the threshold voltages of the dummy memory cells are higher than the first reference threshold voltage;

wherein the first direction being from the string select lines to the word lines and the second direction being from the ground select lines to the word lines.

7. The memory device according to claim 6, wherein on the first direction, the plurality of threshold voltages of the dummy memory cells on the first part of the dummy word lines are gradually increased and higher than the first reference threshold voltage.

8. The memory device according to claim 7, wherein the first part of the dummy word lines at least includes a first dummy word line, a second dummy word line and a third dummy word line, the first dummy word line being adjacent to the string select lines;

the plurality of threshold voltages of the dummy memory cells on the first dummy word line are programmed to have a second reference threshold voltage higher than the first reference threshold voltage;

the plurality of threshold voltages of the dummy memory cells on the second dummy word line are programmed to have a third reference threshold voltage higher than the reference threshold voltage; and the plurality of threshold voltages of the dummy memory cells on the third dummy word line are programmed to have a fourth reference threshold voltage higher than the third second reference threshold voltage.

9. The memory device according to claim 8, wherein on the second direction, the plurality of threshold voltages of the dummy memory cells on the second part of the dummy word lines are gradually increased and higher than the first reference threshold voltage.

10. The memory device according to claim 9, wherein the second part of the dummy word lines at least includes a fourth dummy word line, a fifth dummy word line and a sixth dummy word line, the fourth dummy word line being adjacent to the ground select lines;

the plurality of threshold voltages of the dummy memory cells on the fourth dummy word line are programmed to have the second reference threshold voltage;

the plurality of threshold voltages of the dummy memory cells on the fifth dummy word line are programmed to have the third reference threshold voltage; and the plurality of threshold voltages of the dummy memory cells on the sixth dummy word line are programmed to have the fourth reference threshold voltage.

\* \* \* \* \*